(12) United States Patent
Callahan

(10) Patent No.: US 6,694,448 B2
(45) Date of Patent: Feb. 17, 2004

(54) SRAM ROW REDUNDANCY

(75) Inventor: John M. Callahan, San Ramon, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 535 days.

(21) Appl. No.: 09/799,884

(22) Filed: Mar. 5, 2001

(65) Prior Publication Data

US 2002/0157038 A1 Oct. 24, 2002

(51) Int. Cl.[7] .......................... G06F 11/00; G01R 31/28
(52) U.S. Cl. ............................................ 714/7; 365/201
(58) Field of Search .............................. 714/7, 6, 8, 30, 714/47, 42, 735, 742, 719; 365/201, 200

(56) References Cited

U.S. PATENT DOCUMENTS

| | | | |
|---|---|---|---|
| 5,798,974 A | * | 8/1998 | Yamagata .................... 365/200 |
| 6,275,426 B1 | * | 8/2001 | Srinivasan et al. .......... 365/200 |
| 6,349,064 B1 | * | 2/2002 | Nakaoka ...................... 365/200 |
| 6,445,628 B1 | * | 9/2002 | Pereira et al. ............... 365/200 |
| 6,456,527 B1 | * | 9/2002 | Campardo et al. ..... 365/185.03 |

FOREIGN PATENT DOCUMENTS

| | | | |
|---|---|---|---|
| GB | 2309774 A | 8/1997 | ........... B60Q/1/115 |
| JP | 59195442 | 11/1984 | ............ B60Q/1/10 |

* cited by examiner

Primary Examiner—Nadeem Iqbal
(74) Attorney, Agent, or Firm—Patrick T. King

(57) ABSTRACT

A fuse-controlled, row-redundancy control system and method for a SRAM includes a multi-bit, defective-row storage array of static circuits that are programmed to store one of the address bits of a predetermined defective row of the SRAM and that includes a single fuse. The single fuse is blown to indicate a first state of the one of the address bits and is not blown to indicate a second state of the one address bit. The address bits of the predetermined defective row of the SRAM are compared with corresponding address bits of row-address signals received by the SRAM. The comparator includes a fuseless, exclusive logic circuit and provides a RFLAG control signal that indicates that the stored address bits of the defective row of the SRAM match the respective received row address bits for the SRAM. The RFLAG control signal disables a word line corresponding to the defective row of the SRAM and also enables a redundant SRAM word line corresponding to a redundant SRAM row so that a redundant SRAM row is substituted for the defective row of the SRAM.

10 Claims, 8 Drawing Sheets

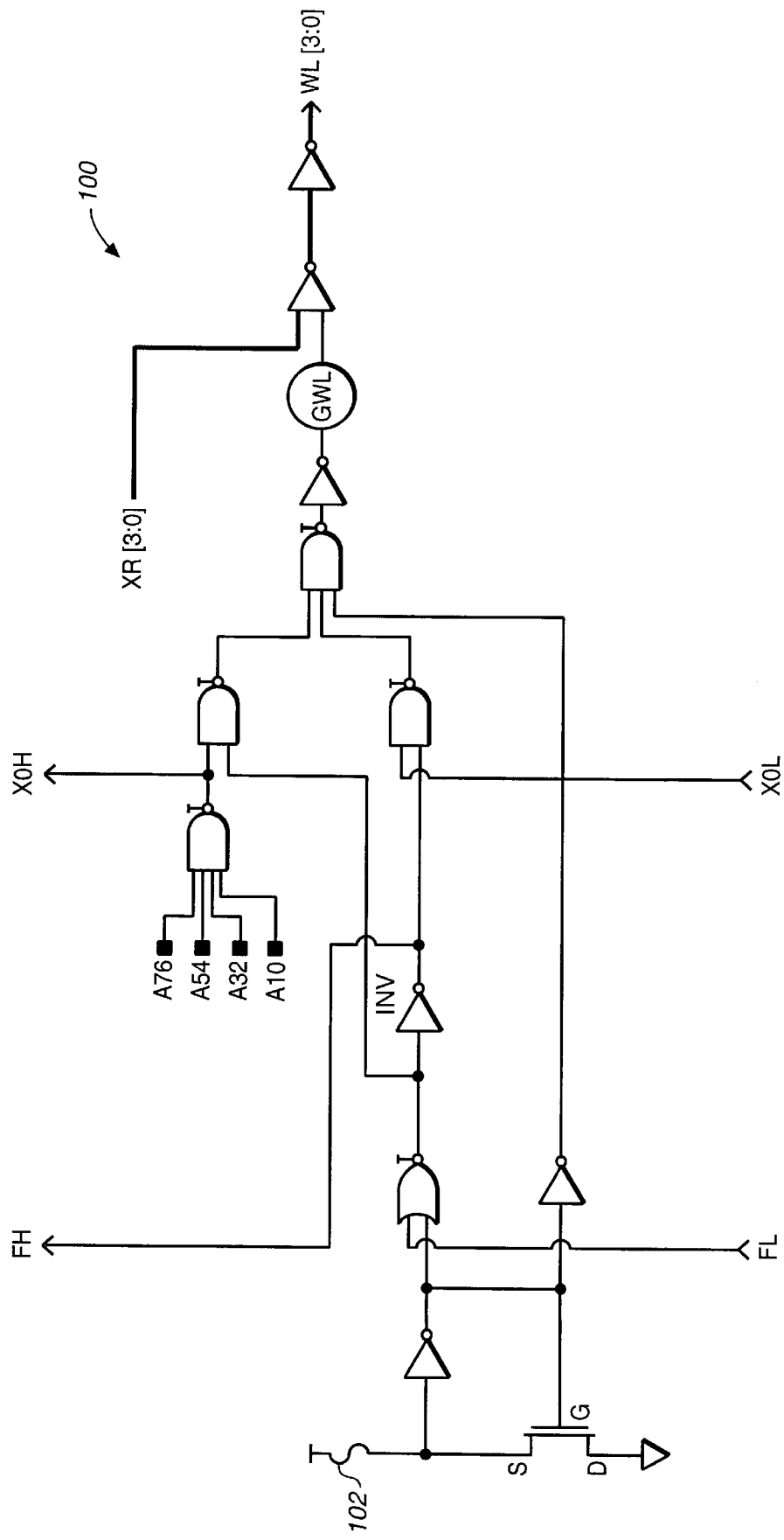
FIG._1 (PRIOR ART)

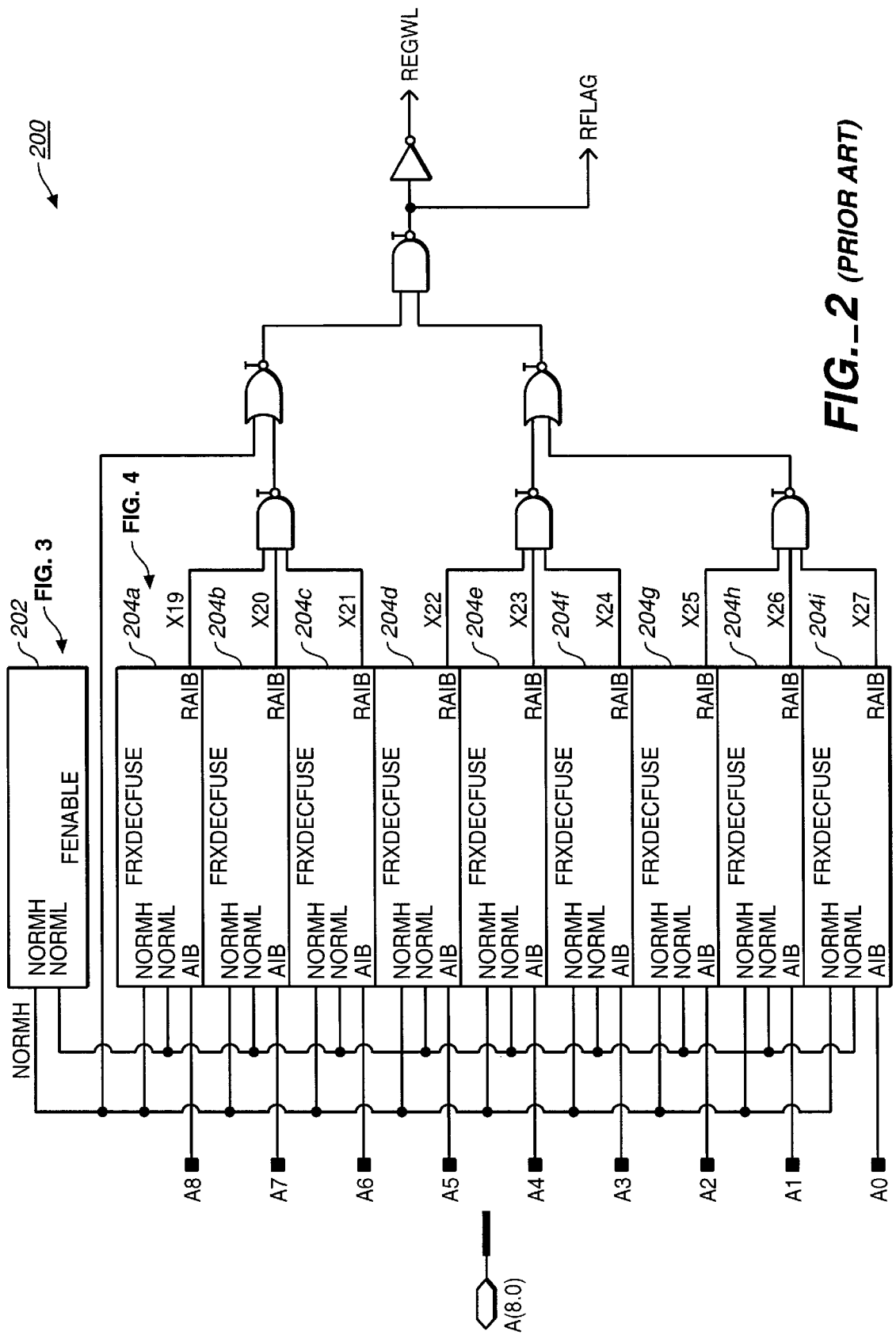
FIG._2 (PRIOR ART)

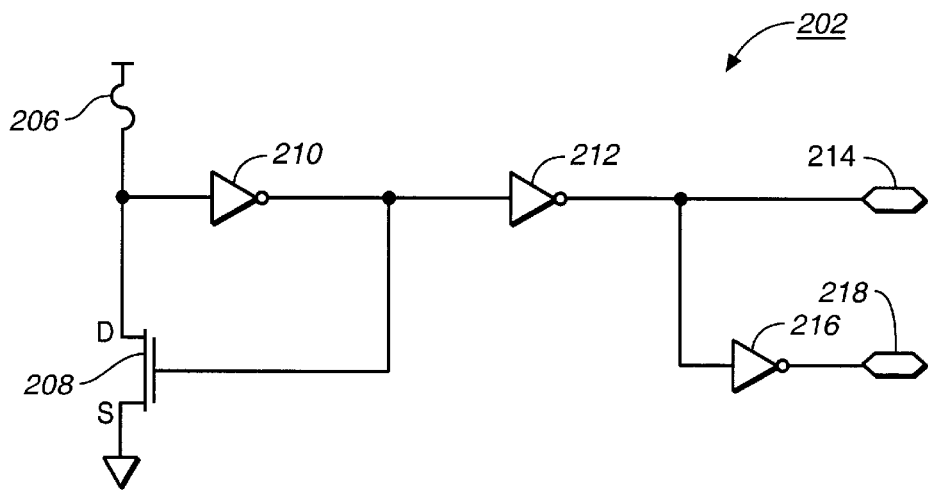
FIG._3 *(PRIOR ART)*
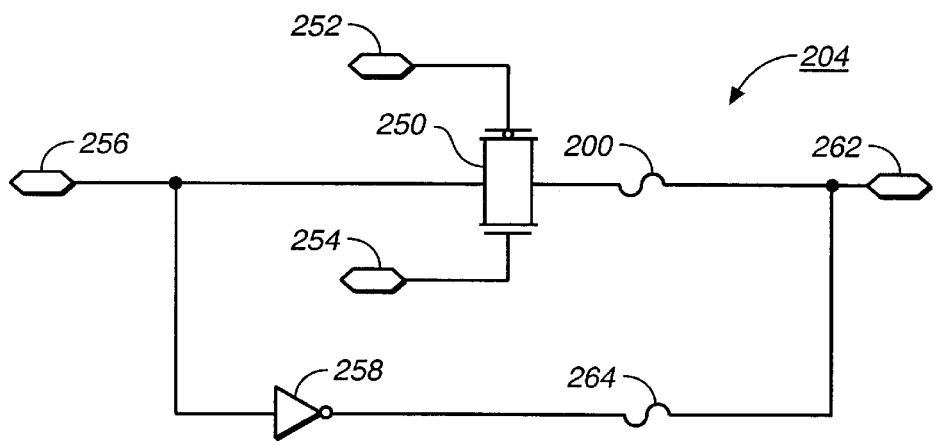
FIG._4 *(PRIOR ART)*

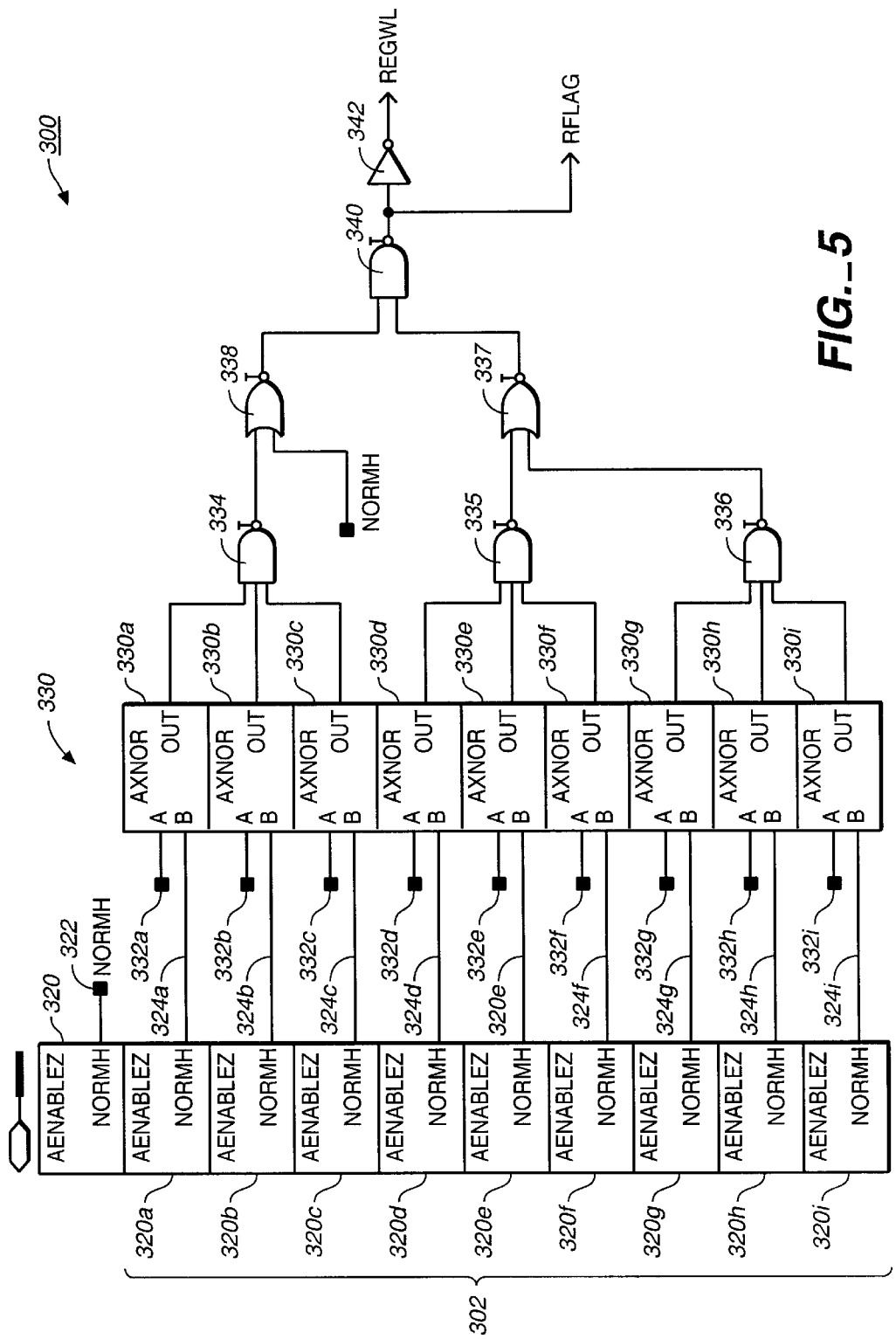
FIG._5

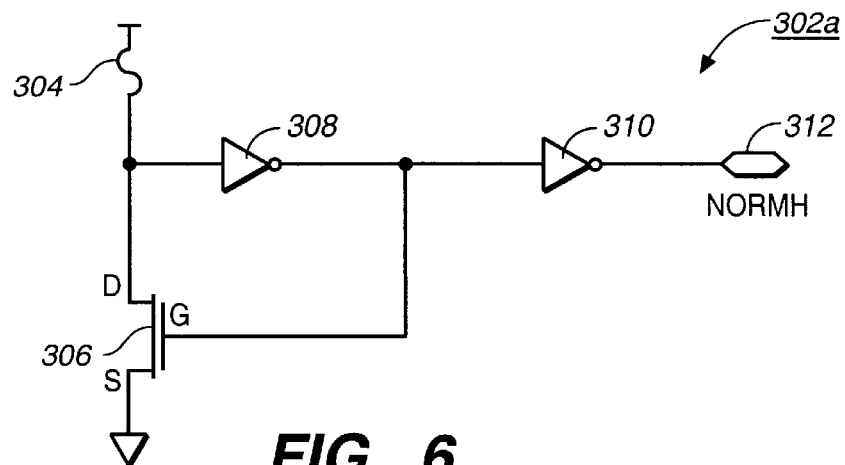
FIG._6
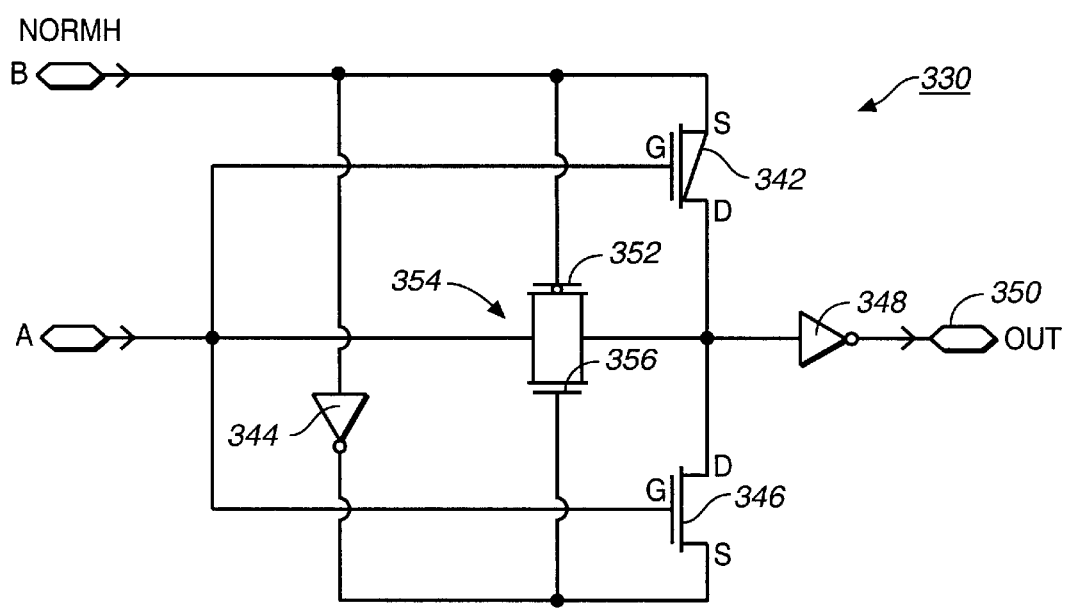
FIG._7

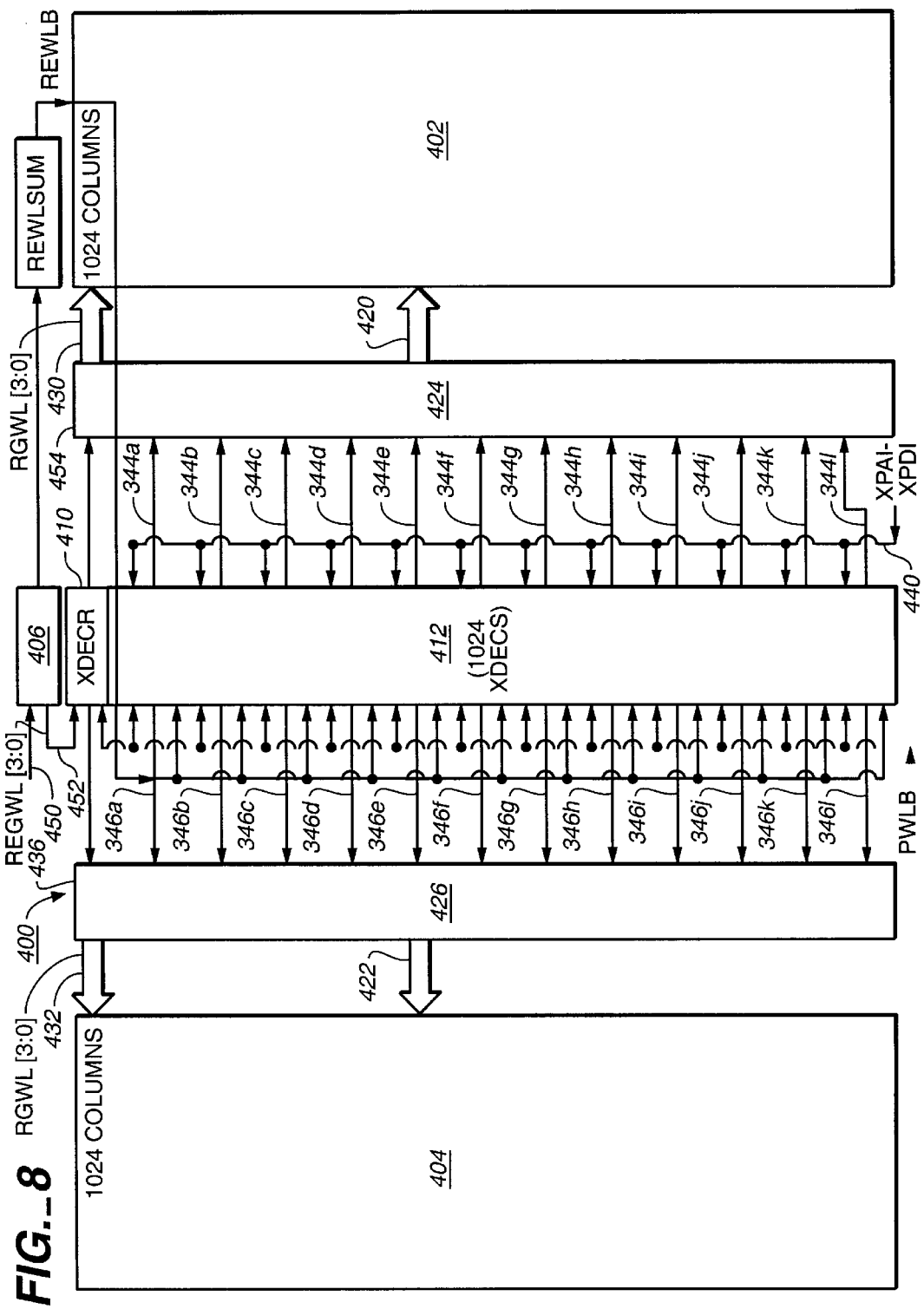
FIG._8

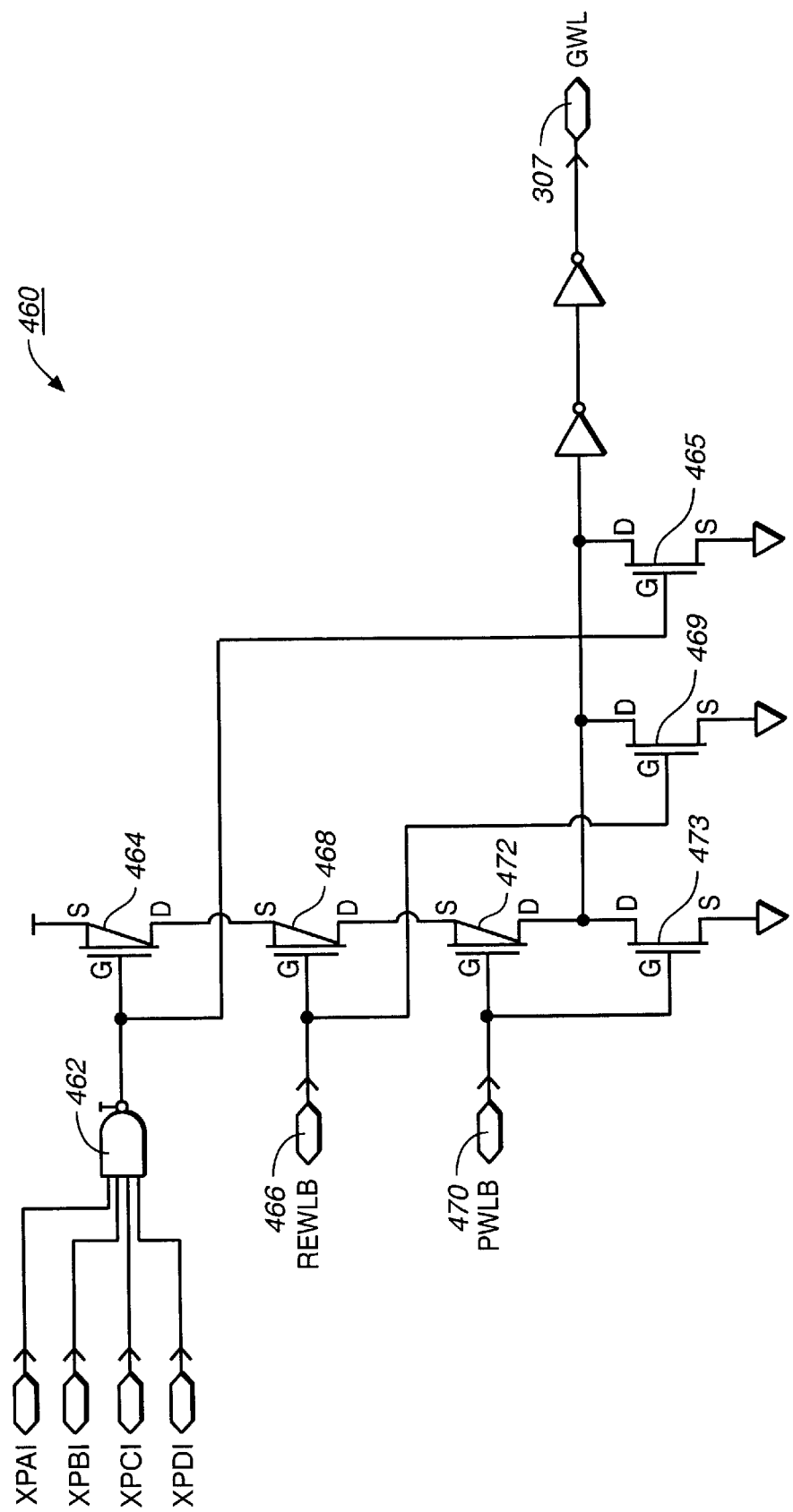
FIG._9

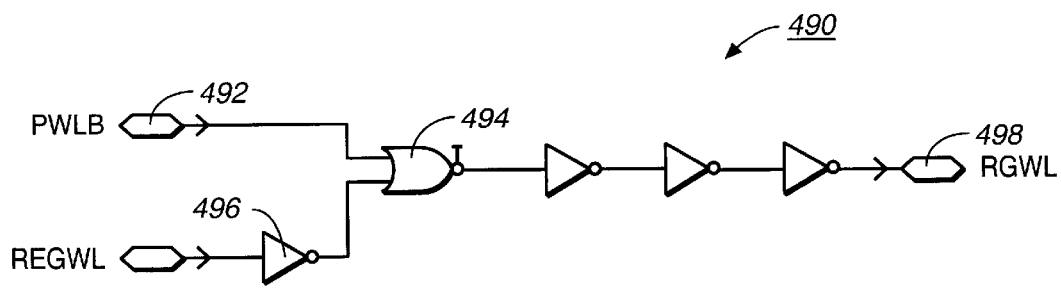
FIG._10
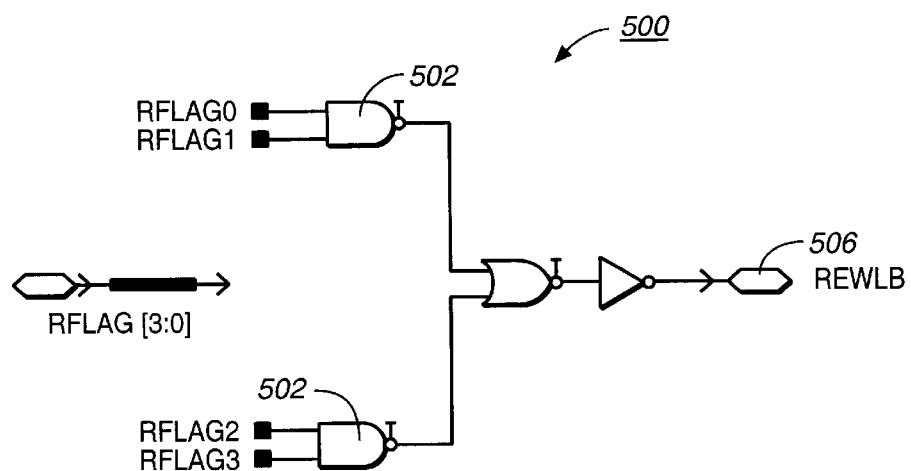
FIG._11

SRAM ROW REDUNDANCY

BACKGROUND OF THE INVENTION

1. Field of the Invention

This invention relates to static random access memories (SRAMs) and, more particularly, to techniques for replacement of a defective row in a SRAM with a redundant row.

2. Prior Art

If one or more memory cells in a row of a SRAM array are defective, the entire row is considered to be defective and must be replaced with a redundant row in the array. The prior art uses two techniques for replacement of a defective row in a SRAM. One such technique is called a "shift" method and the other technique is called a "brute force" method.

FIG. 1 illustrates a typical global word line (GWL) control circuit 100 that is used to implement the prior art "shift" method that provides one type of row redundancy for the word lines in a SRAM memory. For an exemplary SRAM with a total of 2048 word lines, four word lines (WLs) are grouped into one global word line (GWL) so that 512 GWLs are used for the SRAM with 2048 word lines. Each GWL then uses a 4:1 post-decode circuit to access each of the four WLs in a particular GWL. This shift technique uses a separate GWL control circuit 100 for each of the 512 GWLs. Each control circuit 100 uses one GWL fuse element 102 for each GWL, so that a total of 512 fuses are used for the 512 GWLs and the corresponding 2048 WLs.

The 512 separate GWL control circuits are arranged in a cascade arrangement of separate GWL control circuits, one for each GWL. When a fuse 102 for a particular GWL control circuit is blown, each control circuit beyond the defective row shifts all of the memory cells up one row in the SRAM memory array. All of the addressing accommodates this shifted arrangement. Each control circuit 100 has a FH terminal that is connected to a corresponding FL terminal of the next higher GWL control circuit. Each control circuit 100 also has a XDH terminal that is connected to a corresponding XDL terminal of the next higher GWL control circuit. For the bottommost GWL control circuit, XDEC, FL and XDL are connected to VSS, or ground. Predecode address signals A76, A54, A32, and A10 are all connected to VSS for the top GWL control circuit. Postdecode address signals XR[3:0] are provided to select one of four word lines WL associated with a GWL. Each of the output signals WL[3:0] activates one of the four WLs associated with a particular GWL.

There are several criteria for determining that a row in the SRAM is a defective row. A row is determined to be defective because it has a single bad bit, more than one bad bit, or the entire row is defective for some reason. An associated GWL fuse element 102 is blown for the defective row. This disables the GWL control circuit 100 and shifts the GWL control operation physically to a next GWL control circuit above. This shift continues up until the actual control circuit for the redundant GWL row is reached at the top of the rows of GWL control circuits.

An advantage of the shift method is that only one fuse needs to be to blown for the GWL control circuit of a defective memory row. However, an important disadvantage of the shift method is that it requires a fuse to be available for each GWL control circuit , so that, for example, 512 virgin fuses are required for the 512 GWL control circuits, even though only one fuse is to be blown. A further disadvantage is that this type of system is not flexible because only one defective memory row out of 512 memory rows can be replaced with this method.

For the shift technique, the decoder redundancy could be further subdivided by dividing the memory into several smaller memory blocks with a redundant GWL control circuit and a redundant memory row for each smaller memory block. For a memory with 512 GWL control circuits that is divided into four memory blocks, one redundant GWL control circuit is provided for every 128 GWLs. This still limits this technique to one redundant GWL for 128 GWLs. If the 128 GWL group had two bad GWLs, this technique would not work even though there may be three other unused redundant GWL control circuits and redundant memory rows provided for the other three 128-row groups.

FIG. 2 illustrates another redundancy control circuit 200 for providing row redundancy for a defective SRAM row. This circuit uses a so-called "brute force" technique because it disables all of the regular GWLs and activates a redundant GWL whenever an address for a defective row is detected. The input signals to the redundancy control circuit 200 are nine bits [A0:A8] of a nine-bit address signal. The output control signals of the redundancy control circuit 200 are a redundant GWL control signal REGWL and a RFLAG signal that turns off the regular GWLs. When the RFLAG signal goes to 0, it turns off all the regular GWLs and brings up the redundant GWL control signal REGWL. The defective redundancy control circuit 200 includes a fuse enable FENABLE circuit 202 and 9 fuse decoder circuits FRXDECFUSE circuits 204a–204i.

FIG. 3 illustrates the FENABLE circuit 202. When it is not blown open, a fuse element 206 provides a VCC voltage to the drain terminal of a pull-down NMOS transistor 208 and to an input terminal of a first inverter 210. The Gate terminal of the pull-down NMOS transistor 208 is connected to the output terminal of the first inverter 210. The output terminal of the inverter 210 is connected to an input terminal of a second inverter 212. The output terminal of the second inverter 212 is connected to a NORMH output terminal 214 and to an input terminal of a third inverter 216, the output terminal of which is connected to a NORML terminal 218. When the fuse element 206 is blown open, the drain terminal of the pull-down transistor 208 is at a low voltage, which is inverted through the first inverter 210 to turn on the pull-down transistor 208. This provides a high signal at the NORMH terminal 214 and a low signal at the NORML terminal 218.

FIG. 4 illustrates a typical FRXDECFUSE circuit 204 that includes a transfer gate 250 that is controlled by the NORMH and NORML signals at terminals 252 and 254, respectfully. An AIB input terminal 256 to the transfer gate 250 is connected to the input terminal of the transfer gate 250 and to an input terminal of an inverter 258. An output terminal of the transfer gate 250 is connected through a fuse element 260 to an RAIB output terminal. An output terminal of the inverter 258 is connected through another fuse element 264 to the RAIB output terminal. When the RFLAG signal goes to 0, it turns off all the regular GWLs and brings up the redundant GWL signal REGWL.

An advantage of the brute force method is that it is very flexible. If setup for 4 redundant GWLs per 512 regular GWLs, you are not limited to just one redundant GWL per 128 GWL as in the shift method. This method could accommodate bad memory rows associated with 4 GWLs in a 128 GWL group. This method also requires less total virgin fuses because 19 fuses are required per redundant GWL. A disadvantages of this method is that 10 fuses need to be blown per redundant GWL. The requirement of 19 virgin fuses for each of the four redundant GWL is a disadvantage.

Consequently, a need exists for an SRAM with a more cost-effective, efficient technique for controlling a redundant row substituted for a defective row.

SUMMARY OF THE INVENTION

It is therefore an object of the invention to provide a fuse-controlled redundancy control system for a SRAM that, overall, uses fewer virgin fuses, which equates to less fuse area that provides a smaller chip size and a lower chip cost.

It is another object of the invention to provide a fuse-controlled redundancy control system for a SRAM that has fewer fuses to blow, which results in less time required for a laser to blow fuses and which proves for lower chip cost.

It is another object of the invention to provide a fuse-controlled redundancy control system for a SRAM that provides flexibility in designating redundant rows, which results in more die area saved and a lower chip cost.

In accordance with these and other objects of the invention, a fuse-controlled, row-redundancy control system for a SRAM is provided which includes a defective-row multi-bit storage array of static circuits, each of which static circuits is programmed to store one of the address bits of a predetermined defective row of the SRAM. Each of the static circuits includes a single fuse that is blown to indicate a first state of the one of the address bits and that is not blown to indicate a second state of the one address bit A comparator compares the address bits of the predetermined defective row of the SRAM with corresponding address bits of row-address signals that are received by the SRAM. The comparator includes a fuseless, exclusive logic circuit that compare individual bits of the row address signals received by the SRAM to corresponding ones of the address bits of the predetermined defective row of the SRAM. The comparator also provides a RFLAG control signal that indicates that the stored address bits of the defective row of the SRAM match the respective received row address bits for the SRAM. The RFLAG control signal also disables a word line corresponding to the defective row of the SRAM and enables a redundant SRAM word line for a redundant SRAM row so that a redundant SRAM row is substituted for the defective row of the SRAM.

The system further includes a decoder for decoding each global word line from one of the plurality of local word lines. The present invention is also applicable to a SRAM that does not use global word lines.

The fuseless exclusive-logic circuit also includes a preset control signal for initially enabling the comparator.

A method according to the present invention is provided for substituting a redundant row for a predetermined defective row of a SRAM. The method includes storing address bits of a defective row of the SRAM in an array of static circuits, where each of the static circuits includes a single fuse that is blown to indicate a first state of its respective address bit and that is not blown to indicate a second state of its respective address bit. Each of the stored address bits of the defective row of the SRAM is compared with a corresponding received row address bit for the SRAM to provide a RFLAG control signal that indicates that the stored address bits of the defective row of the SRAM match the respective received row address bits for the SRAM. When the RFLAG control signal is provided, a SRAM word line corresponding to the defective row of the SRAM is disabled and a redundant SRAM word line for a redundant SRAM row is enabled so that a redundant SRAM row is substituted for the defective row of the SRAM.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a circuit diagram of a GWL control circuit that is one of a cascaded arrangement of such circuits, each of which are provided with a global word line and is used to implement a prior art "shift" method for providing row redundancy for a defective SRAM memory row.

FIG. 2 is a circuit diagram of a prior art, so-called "brute force" address detector circuit for a defective SRAM row.

FIG. 3 is a circuit diagram of a FENABLE circuit having a fuse that is initially blown to enable the address detector circuit of FIG. 2.

FIG. 4 is a circuit diagram of a FRXDECFUSE circuit, each of which contains two fuses and a number of which are used to detect the address bits of a defective row for the defective row address detector circuit for a defective SRAM row of FIG. 2.

FIG. 5 is a circuit diagram of a redundant x decoder ARXDEC circuit for detecting an address signal of a defective row of a SRAM, according to the invention.

FIG. 6 is a circuit diagram of a single-fuse AENABLE2 circuit, according to the invention, used in FIG. 5 for storing one bit of the address of a defective row of the SRAM.

FIG. 7 is a circuit diagram of an AXNOR circuit, according to the invention, that compares a static bit of an address of a defective row of a SRAM to a corresponding bit of an address signal received by the SRAM.

FIG. 8 is a simplified block diagram of an 8 M-bit SRAM that incorporates a fuse-controlled row-redundancy control system having a redundant x decoder RXDEC subsystem that uses a number of ARXDEC circuits of FIG. 5, a redundant word line summer REWLSUM, a redundant x decoder XDECR subsystem, and a regular X decoder subsystem XDEC.

FIG. 9 is a block diagram of an x-decoder circuit AXDEC, a number of which are used in the XDEC subsystem of FIG. 8 for decoding and gating a control signal for a regular global word line.

FIG. 10 is a block diagram of a redundant-row AXDECR gating circuit that gates a control signal for a redundant global word line.

FIG. 11 is a block diagram of a redundant word line summing circuit that disables regular global word lines when an address for a defective global word line is received.

DETAILED DESCRIPTION OF THE PREFERRED EMBODIMENT

Reference is now made in detail to a preferred embodiment of the invention, an example of which is illustrated in the accompanying drawings. While the invention is described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims. While the description below is for a SRAM that uses global word lines, the present invention is also applicable to controlling redundant rows in a SRAM that does not use global word lines.

FIG. 5 is a circuit diagram of a redundant x decoder ARXDEC circuit 300, according to the invention. The redundant x decoder ARXDEC circuit 300 is a multi-bit storage array 302 of nine AENABLE2 circuits 302a–302i that are static circuits, each of which is programmed with a single fuse to store one of the address bits of a global word line for a predetermined defective row of the SRAM.

FIG. 6 is a circuit diagram of a typical single-fuse AENABLE2 circuit 302a. Each of the AENABLE circuits use only one fuse to program a particular address bit of a defective SRAM row. The single fuse element 304 has one terminal connected between a VCC potential and a second terminal connected to a drain terminal of a pull-down NPN transistor 306, which has a source terminal connected to a VSS or ground potential. The second terminal of the single fuse element 30K is connected to an input terminal of an inverter 308 that has an output terminal connected to a gate terminal of the pull-down NPN transistor 306 and to an input terminal of a second inverter 310.

The second inverter 310 has an output terminal that is connected to a normally high NORMH output terminal 312. The signal level at the normally high NORMH output terminal 312 is HIGH when the single fuse element 304 is not blown, or in a first state. The single fuse element 304 is blown to indicate a second state, such a LOW or ZERO state, of its corresponding address bit. When the fuse 304 is blown, pull-down NPN transistor 306 turned on and the NORMH signal at terminal 312 goes to a LOW state.

With reference to the redundant x decoder ARXDEC circuit 300 of FIG. 5, another AENABLE2 circuit 320 is provided. The fuse of this circuit is blown to provide a preset control signal at a terminal 322 for enabling operation of output logic circuits of the redundant x decoder ARXDEC circuit 300.

FIG. 5 also shows nine AXNOR circuits 330a–330i that compare respective address bits of a global word line for a predetermined defective row of the SRAM with corresponding address bits of global word line signals received by the SRAM at input address terminals 332a–332i. The respective input address terminals are connected to corresponding "A" input terminal of the AXNOR circuits 330a–330i. Respective NORMH signals from corresponding AENABLE2 circuits 302a–302i are provided at each "B" input terminal of the AXNOR circuits on signal lines 324a–324i.

FIG. 7 is a circuit diagram of a AXNOR circuit 330, according to the present invention, that uses exclusive logic to compare a respective address bit of the global word line for a predetermined defective row of the SRAM with a corresponding address bit of all of the global word line signals received by the SRAM. The AXNOR circuit is an EXCLUSIVE-NOR circuit that provides a ONE output when the two input signals match and a ZERO output when the two input signals do not match. Respective address bits of all of the global word line address bits from the input address of the SRAM are provided at each A input terminal of the AXNOR circuits. Respective static NORMH output signals from the AEABLE2 circuits 302a–302i are provided at each B input terminal of the AXNOR circuits.

The B input terminal is connected to a source terminal of a PMOS pull-up transistor and through an inverter 344 to the source terminal of a NMOS pull-down transistor 346. The drain terminals of the PMOS transistor 342 and the NMOS transistor 346 are connected through an inverter 348 to an OUT terminal 350. The B input terminal is also connected to a gate terminal of a PMOS transistor 352 of a transmission gate 354 and through the inverter 344 to a gate terminal of a NMOS transistor 356 of the transmission gate 354.

When the NORMH signal at the B input terminal is LOW, the transmission gate 354 is turned on. A HIGH signal at the A input terminal provides a LOW signal at the OUT terminal 350. A LOW signal at the A input terminal provides a HIGH signal at the OUT terminal 350.

When the NORMH signal at the B input terminal is HIGH, the transmission gate 354 is turned off. In this case, a HIGH signal at the A input terminal turns off the pull-up transistor 342 and turns on the pull-down transistor 346 so that the signal at the input terminal of the inverter 348 goes LOW and the signal at the OUT terminal 350 goes HIGH.

When the NORMH signal at terminal B is HIGH and the signal at terminal A is LOW the LOW signal at terminal A turns on the pull-up transistor 342 and turns off the pull-down transistor 346 so that the signal at the input terminal of the inverter 348 goes HIGH and the signal at the OUT terminal 350 goes LOW.

The result of the above operation of the EXCLUSIVE-NOR AXNOR circuit is that when the signals at terminals A and B match, the signal at the OUT terminal is a HIGH level and that when the signals at terminals A and B do not match, the signal at the OUT terminal is a LOW level. It can be seen that the comparator includes a fuseless exclusive-logic circuit that compares each bit of the global word line signals received by the SRAM to corresponding ones of the address bits of the global word lines for the predetermined defective row of the SRAM.

FIG. 5 shows that the OUT signals from the AXNOR circuits 330a–330i are provided to respective input terminals of three 3-input NAND gates 334, 335, 336. All HIGH signal levels at the input terminals of each of the 3-input NAND gates 334, 335, 336 produce LOW or ZERO levels at their output terminals. The output terminals of two of the 3-input NAND gates 335, 336 are connected to respective input terminals of a 2-input NOR gate 337. The output terminal of the 3-input NAND gate 33K is connected to one input terminals of another 2-input NOR gate 338. THE NORMH output terminal of the ANEABLE2 circuit 320 is connected to the other input terminal of the 2-input NOR gate 338. The output levels of the NOR gate 337, 338 are both HIGH when all of their input signals are LOW.

The output terminals of the 2-input NOR gates 337, 338 are connected to respective input terminals of a 2-input NAND gate 340. An output terminal of the 2-input NAND gate 340 is connected to a RFLAG terminal and to an input terminals of an inverter 342 that has an output terminal providing a REGWL control signal.

When all of static address bits of a global word line for a predetermined defective row of the SRAM match with corresponding input address bits of the global word line signals received by the SRAM at input address terminals 332a–332i, all of the output signals of the AXNOR circuits 330a–330I go to HIGH levels so that the input signal levels to the NOR gates 337, 338 go to ZERO. If the NORMH signal at terminal 322 is also LOW, the output signals levels of the 2-input NOR gates 337, 338 both go HIGH to provide a ZERO signal level for RFLAG and a ONE signal level for REGWL.

A match for a defective row activates the REGWL signal. A match for a defective row also activates the signal RFLAG, which turns off the regular GWLs and activates the redundant GWL.

FIG. 8 illustrates an 8 Mbit SRAM 400 that is partitioned into two main memory sections, including a first main memory section 402 and a similar second main memory section 404. The 8 M-bit SRAM 400, according to the present invention, uses, for example, four single-fuse redundant x decoder ARXDEC subsystems 300 of FIG. 5 in a redundant x decoder RXDEC circuit 406.

The 8 MBit SRAM 400 also includes a redundant word line summer REWLSUM circuit 408, a redundant-row AXDECR gate circuit 410, and a regular X decoder subsystem XDEC 412.

The first and second main memory sections each have 4096 regular rows that are accessed by word line signals on 4096 regular local word lines LWL provided in respective busses 420, 422. The 4096 regular local word lines of each of the first and second main memory sections 402, 404 are grouped by fours into 1024 regular global word lines that are decoded respective GWL/LWL decoders 424, 426.

The first and second main memory sections each have 16 redundant rows that are accessed by word line signals on 16 redundant local word lines provided in respective busses 430, 432. The 16 redundant local word lines are grouped by fours into four redundant global word line that are decoded by respective redundant GWL/LWL decoders 434, 436.

The regular x-address decoder circuit XDEC 412 receives predecoder address signals XPAI, XPBI, XPCI, and XPDI on a bus 440. The predecoder address signals XPAI, XPBI, XPCI are 8-bit signals that are each received on eight signal lines in the bus 440. The XPDI predecoder address signal is a 2 bit signal. Each bit is received on one of 2 signal lines in the bus 440. A controlling clock signal PWLB is provided to the regular x-address decoder circuit XDEC 412 on a signal line 442. The redundant-row AXDECR gate circuit 410 is used to gate a control signal for a selected global word line.

The regular x-address decoder circuit XDEC 412 provides global word line signals on two sets of global word lines GWL[1023:0] to the respective GWL/LWL decoders 424, 426. The GWLS are typically illustrated in FIG. 8 as 344(a)–344(l) and 346(a)–346(l). Each GWL is decoded into 4 local word lines (LWLs), one for each of the 4 sections by a GWL/LWL decoder 310. Consequently, each of the main memory sections 402, 404 has 4096 LWLs and 16 redundant LWLs. The main memory sections 402, 404 have 1024 columns so that each row of a memory section has 1024 bits, exclusive of any additional columns used for column-redundancy.

The regular x-address decoder circuit XDEC 412 includes two sets of 1024 x-decoder circuits AXDEC, one for each global word line. FIG. 9 illustrates a typical x-decoder circuit AXDEC 460 that provides a HIGH GWL signal level to an output terminal 307 when a particular GWL is selected. Input terminals of a 4-input NAND receive the predecoder address signals XPAI, XPBI, XPCI, and XPDI. An output terminal of the 4-input NAND gate 462 is connected to gate terminals of a PMOS pull-up transistor 464 and a NMOS pull-down transistor 465. When the predecoder address signals XPAI, XPBI, XPCI, and XPDI all are HIGH, the drain terminals of transistors 464, 465 goes to a HIGH level.

An input terminal 466 is connected to gate terminals of a PMOS pull-up transistor 468 and a NMOS pull-down transistor 469. The drain terminals of transistors 469 connected to the drain terminals of the transistor 465. The source terminal of transistor 468 is connected to the drain terminal of transistor 464. REWLB signal at the input terminal 466 is normally at a LOW level to turn on transistor 468 and to turn off transistor 469.

A clock input terminal 470 is connected to gate terminals of a PMOS pull-up transistor 472 and a NMOS pull-down transistor 473. The drain terminals of transistor, a 472 also connected to the drain terminals of the transistors 465 and 469. A LOW state of the controlling clock signal PWLB at the clock input terminal 470 turns on transistor 472 and turns off transistor 473.

Signals at the drain terminals of the transistors are serially passed through two inverters 476, 477 to the output terminal 307. When any of the signals at the gates of the various transistors are HIGH, one of the pull-down transistors 465, 469. 473 is turned on to pull Node N1 LOW. A LOW signal level at Node N1 provides a LOW signal level at terminal 307 to disable a particular GWL. A HIGH signal level at Node N1 provides a HIGH signal level at terminal 307 to enable a particular GWL.

The redundant x decoder RXDEC circuit 406 for the 8 M-bit SRAM 400, according to the present invention, uses four single-fuse redundant x decoder ARXDEC subsystems 300 as described in connection with FIG. 5. The redundant X decoder RXDEC circuit 406 receives multi-bit memory address ADDRESSES signals on a multi-bit address bus 450. When an address for a defective row is received, an output bus 480 from the redundant X decoder RXDEC circuit 406 provides one of four redundant global word line control signals REGWL [3:0] to redundant-row AXDECR gate circuit 410.

FIG. 10 is a block diagram of an AXDECR circuit 490, four of which are used in the redundant-row AXDECR gate circuit 410. A clock input terminal 492 for the controlling clock signal PWLB is connected to one input terminal of a 2-input NOR gate 494. A redundant global word line signal REGWL is connected through an inverter 496 to another input terminal of the 2-input NOR gate 494. When the REGWL signal goes HIGH, the controlling clock signal PWLB gates on the RGWL signal at terminal 498 to select one of the redundant rows.

FIG. 11 is a block diagram of a redundant word line summing circuit 408 that has two 2-input NAND gates that receive four RFLAG[3:0] signals from the RXDEC circuit 406 and that provides a REWLB signal at an output terminal 506. The REWLB signal disables the AXDEC circuits that are typically illustrated in FIG. 9 and a number of which are used in the XDEC 412 of FIG. 8. The REWLB signals disables all of the regular word lines in favor of one of the redundant word lines.

A redundant x decoder ARXDEC circuit provided according to the invention uses the single-fuse AENABLE2 of FIG. 6 for storing one bit of the address of a defective row of the SRAM. The redundant x decoder ARXDEC circuit provided according to the invention also uses the AXNOR circuit of FIG. 7 to compare a static bit of an address of a defective row of a SRAM to a corresponding bit of an address signal received by the SRAM. This combination provides some advantages over the prior art. A redundant x decoder ARXDEC circuit provided according to the invention requires an average of 5.5 fuses to be blown per redundant GWL. While this number of fuses is greater than that of the shift method, it is almost half of the number required for the brute force method. A redundant x decoder ARXDEC circuit provided according to the invention requires only 10 virgin fuses per redundant GWL. A redundant x decoder ARXDEC circuit provided according to the invention is totally flexible in terms of allocating a redundant word line to a defective row.

Comparison of the 3 Methods:
For 4 redundant GWLs per 512 regular GWL.

|  | SHIFT | BRUTE | NEW |
|---|---|---|---|
| Total number of fuses | 512 | 76 | 40 |
| Num. of virgin fuses/ redundant GWL | n/a | 19 | 10 |
| Number of fuses blown/ redundant GWL | 1 | 10 | 5.5 |
| Totally flexible | no | yes | yes |

In comparison to the present invention, the shift method is inflexible in the sense of accommodating for several defective rows. The shift method also requires a very large number of fuses, each of which uses a relatively large area of a die so that having fewer virgin fuses uses less fuse area and results in a smaller chip and lower chip cost.

In comparison to the present invention, the brute force method is also flexible but has a greater total number of fuses that uses a larger area of a die. In comparison to the present invention, the brute force method also requires a larger number of fuses to be blown. The number of fuses to be blown is significant because of fuse yield, that is, a certain number of fuses do not blow even if they are struck with laser energy. This is a condition that can occur with polysilicon fuses that may be buried in a chip or with metal fuses that are in a metal layer within the chip.

It is clear that a redundant x decoder ARXDEC circuit 300 of FIG. 5 provided according to the invention presents advantages over the prior art techniques, as illustrated with the above example.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A fuse-controlled, row-redundancy control system for a SRAM with global word lines that includes a plurality of local word lines, comprising:

a defective-row multi-bit storage array of static circuits, each of which static circuits is programmed to store one of the address bits of a global word line for a predetermined defective row of the SRAM and each of which static circuits includes a single fuse that is blown to indicate a first state of the one of the address bits and that is not blown to indicate a second state of the one address bit;

a comparator that compares respective address bits of the global word line for the predetermined defective row of the SRAM with corresponding address bits of global word line signals received by the SRAM;

wherein the comparator includes a fuseless exclusive-logic circuit that compares each bit of the global word line signals received by the SRAM to corresponding ones of the address bits of the global word lines for the predetermined defective row of the SRAM; and wherein the comparator provides a RFLAG control signal that indicates that the stored address bits of the global word lines for the defective row of the SRAM match the respective received global word line bits for the SRAM; and wherein the RFLAG control signal also disables a global word line corresponding to the defective row of the SRAM and enables a redundant global word line for a redundant SRAM row so that the redundant SRAM row is substituted for the defective row of the SRAM.

2. The system of claim 1 including a decoder for decoding the plurality of local word lines associated with each global word line.

3. The system of claim 1 wherein the fuseless exclusive-logic circuit includes a preset control signal for enabling the comparator that compares respective address bits of the global word line for the predetermined defective row of the SRAM with corresponding address bits of global word line signals received by the SRAM.

4. A SRAM comprising:

a SRAM memory cell array;

a defective-row multi-bit storage array of static circuits, each of which static circuits is programmed to store one of the address bits of a global word line for a predetermined defective row of the SRAM memory cell array and each of which static circuits includes a single fuse that is blown to indicate a first state of the one of the address bits and that is not blown to indicate a second state of the one address bit, where each global word line includes a plurality of local word lines for the SRAM memory cell array;

a comparator that compares respective address bits of the global word line for the predetermined defective row of the SRAM memory cell array with corresponding address bits of global word line signals received by the SRAM memory cell array;

wherein the comparator includes a fuseless exclusive-logic circuit that compares each bit of the global word line signals received by the SRAM memory cell array to corresponding ones of the address bits of the global word lines for the predetermined defective row of the SRAM memory cell array; and wherein the comparator provides a RFLAG control signal that indicates that the stored address bits of the global word lines for the defective row of the SRAM memory cell array match the respective received global word line bits for the SRAM; and wherein the RFLAG control signal also disables a global word line corresponding to the defective row of the SRAM and enables a redundant global word line for a redundant SRAM memory cell array row so that the redundant SRAM memory cell array row is substituted for the defective row of the SRAM memory cell array.

5. The SRAM of claim 4 including a decoder for decoding the plurality of local word lines associated with each global word line.

6. A SRAM having a fuse-controlled, row-redundancy control system, comprising:

a defective-row multi-bit storage array of static circuits, each of which static circuits is programmed to store one of the address bits of a word line for a predetermined defective row of the SRAM and each of which static circuits includes a single fuse that is blown to indicate a first state of the one of the address bits and that is not blown to indicate a second state of the one address bit;

a comparator that compares respective address bits of the local word line for the predetermined defective row of the SRAM with corresponding address bits of local word line signals received by the SRAM;

wherein the comparator includes a fuseless exclusive-logic circuit that compares each bit of the local word line signals received by the SRAM to corresponding ones of the address bits of the local word lines for the predetermined defective row of the SRAM; and wherein the comparator provides a RFLAG control signal that indicates that the stored address bits of the global word lines for the defective row of the SRAM match the respective received global word line bits for the SRAM; and wherein the RFLAG control signal also disables a global word line corresponding to the defective row of the SRAM and enables a redundant global word line for a redundant SRAM row so that the redundant SRAM row is substituted for the defective row of the SRAM.

7. The SRAM of claim 6 wherein the fuseless exclusive-logic circuit includes a preset control signal for enabling the comparator that compares respective address bits of the global word line for the predetermined defective row of the SRAM with corresponding address bits of global word line signals received by the SRAM.

8. A method of substituting a redundant row for a predetermined defective row of a SRAM, comprising:

storing address bits of a word line for a defective row of the SRAM in an array of static circuits, each of which static circuits includes a single fuse that is blown to indicate a first state of its respective address bit and that is not blown to indicate a second state of its respective address bit;

comparing each of the stored address bits of the word line for the defective row of the SRAM with a corresponding received row address bit for the word lines of the SRAM;

providing a RFLAG control signal that indicates that the stored address bits of the word line of the defective row of the SRAM match the respective received row address bits for the word lines of the SRAM; and, when the RFLAG control signal is provided, disabling a word line corresponding to the defective row of the SRAM and enabling a redundant word line for a redundant SRAM row so that a redundant SRAM row is substituted for the defective row of the SRAM.

9. The method of claim 8 including grouping the word lines for a defective row of the SRAM into respective global word lines; and decoding the global word lines to provide the word lines.

10. The method of claim 8 including decoding the plurality of local word lines associated with each global word line.

* * * * *